United States Patent [19]

Sato et al.

[11] 4,338,577

[45] Jul. 6, 1982

[54] SEMICONDUCTOR LASER APPARATUS

[75] Inventors: Hideaki Sato; Takashi Kitamura; Koichi Masegi, all of Yokohama; Kazuo Hoshito, Kawasaki, all of Japan

[73] Assignee: Canon Kabushiki Kaisha, Tokyo, Japan

[21] Appl. No.: 87,705

[22] Filed: Oct. 24, 1979

Related U.S. Application Data

[63] Continuation of Ser. No. 822,340, Aug. 5, 1977, abandoned.

[30] Foreign Application Priority Data

Aug. 20, 1976 [JP] Japan .................................. 51-99495
Jul. 5, 1977 [JP] Japan .................................. 52-80103

[51] Int. Cl.$^3$ .............................................. H01S 3/19
[52] U.S. Cl. ...................................... 372/36; 357/19; 357/74; 357/81; 372/29; 372/44
[58] Field of Search ...................... 331/94.5 H, 94.5 P, 331/94.5 S; 357/19, 74, 81, 87, 30, 18; 307/312; 250/211 J, 252

[56] References Cited

U.S. PATENT DOCUMENTS 3,582,324  6/1971  Kunert et al. ................... 357/87 X
3,840,889 10/1974  O'Brien et al. ...................... 357/81
4,058,821 11/1977  Miyoshi et al. ...................... 357/19

FOREIGN PATENT DOCUMENTS 2450950  5/1975  Fed. Rep. of Germany ..... 331/94.5 H
2529313  1/1976  Fed. Rep. of Germany ..... 331/94.5 H
2604788  8/1976  Fed. Rep. of Germany ..... 331/94.5 H

OTHER PUBLICATIONS

Wittke et al., "Stabilization of CW Injection Lasers, RCA Technical Notes," TN No. 1005, Apr. 1975, pp. 1–3.

*Primary Examiner*—James W. Davie
*Attorney, Agent, or Firm*—Fitzpatrick, Cella, Harper & Scinto

[57] ABSTRACT

Semiconductor laser apparatus wherein a semiconductor laser device and a temperature sensor for sensing the temperature of the laser device are mounted on a heat sink or base and airtightly encapsulated. In one embodiment the heat sink or base is mounted on temperature control apparatus which in turn is electrically controlled in response to the output from the temperature sensor. In another embodiment, a laser beam intensity sensor whose output varies over a wide range depending upon an environmental temperature is also temperature controlled so that the semiconductor laser apparatus may be controlled with a higher degree of accuracy.

19 Claims, 15 Drawing Figures

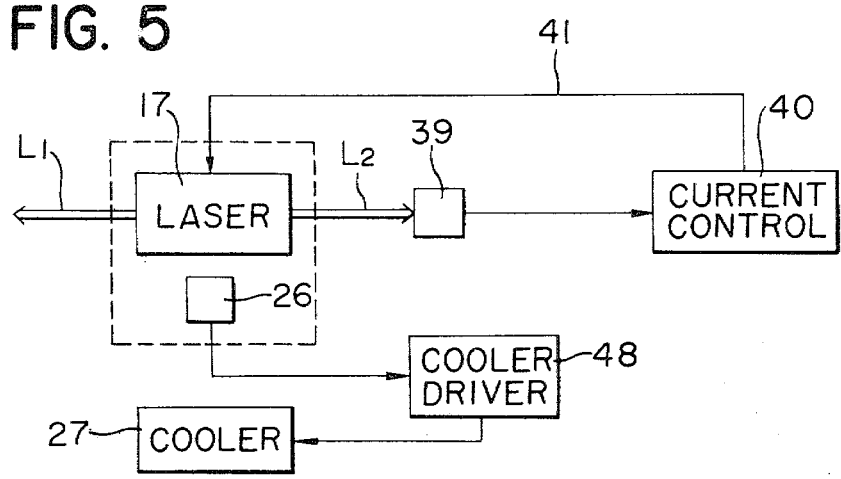
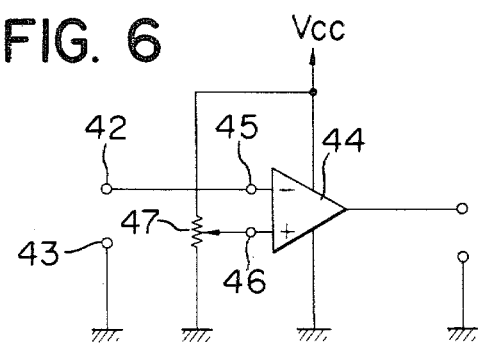
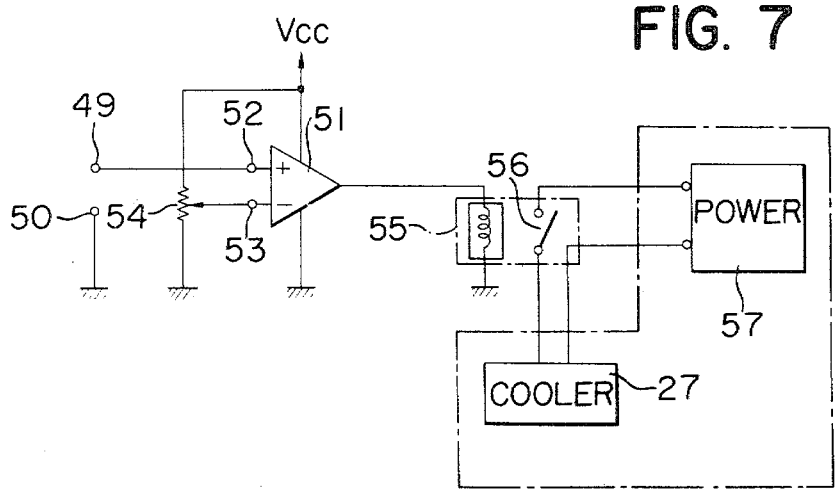

4,338,577

SEMICONDUCTOR LASER APPARATUS

This is a continuation of application Ser. No. 822,340, filed Aug. 5, 1977, now abandoned.

BACKGROUND OF THE INVENTION

1. Field of the Invention

The present invention relates to semiconductor laser apparatus.

2. Description of the Prior Art

Semiconductor laser devices are used in a wide variety of fields because they are compact in size, have a relatively higher efficiency and are capable of producing modulated beams when current is suitably controlled. But it is well known in the art that the intensity of output light from the semiconductor laser device varies over a wide range due to the environmental temperature, ageing of the semiconductor laser device, etc.

In order to maintain the output light intensity constant, there has been proposed a method wherein the intensity of the laser beam emitted from the semiconductor laser device is detected by an intensity sensor, and in response to the output from the intensity sensor a drive circuit controls the current applied to the semiconductor laser in such a manner that the intensity of the laser beam may be maintained constant. However the temperature of the p-n junction (to be referred to as "the junction" hereinafter in this specification) remarkably increases because the density of current flowing through the junction increases to an extreme degree.

Meanwhile the junction temperature vs. output light intensity characteristic curves with the drive current I of the semiconductor laser device as a parameter shown in FIG. 1 are well known in the art. That is, with increase in temperature at the junction, the output light intensity decreases. Therefore when one tries to maintain the output light intensity constant, the output light intensity decreases with increase in temperature at the junction. When current is increased, the output light intensity is increased to an initial level. As described above, however, the increase in current causes the junction temperature to rise, thus resulting in the thermal runaway cycle of the temperature rise, the current increase, the temperature rise, and so on. As a result, stable and reliable operation of the semiconductor laser device cannot be ensured.

As an output light intensity sensor, a semiconductor photoelectric converter may be used because it is convenient to use. Its output, however, depends upon its surrounding temperature so that the control of the semiconductor laser device with a higher degree of accuracy is not accomplished. The sensitivity of the semiconductor output light intensity sensor widely varies depending on its surrounding temperature especially in infrared wavelengths, which are emitted by most semiconductor lasers. Therefore, it is essential that the output light intensity sensor must be also maintained at a constant temperature so that the semiconductor laser device will be controlled with a desired degree of accuracy.

SUMMARY OF THE INVENTION

One of the objects of the present invention is therefore to provide a semiconductor laser apparatus which may emit laser beams of a constant intensity in a stable and reliable manner.

Another object of the present invention is to provide a semiconductor laser apparatus which is very compact in size yet capable of emitting laser beams in a highly reliable and dependable manner.

A further object of the present invention is to provide a semiconductor laser apparatus which is adapted to maintain its semiconductor laser device at a constant temperature.

A still further object of the present invention is to provide a semiconductor laser apparatus which is adapted to maintain the intensity of laser beams emitted from the semiconductor laser device constant.

BRIEF DESCRIPTION OF THE DRAWINGS

The present invention will become apparent from the following description of preferred embodiments thereof taken in conjunction with the accompanying drawings:

FIG. 5 is a schematic block diagram of a control circuit for controlling the semiconductor laser apparatus shown in FIGS. 4A and 4B;

FIG. 6 is a schematic diagram of a current control of the control circuit shown in FIG. 5;

FIG. 7 is a schematic diagram of a cooler unit of the control circuit shown in FIG. 5;

DESCRIPTION OF THE PREFERRED EMBODIMENTS

First Embodiment, FIGS. 2 through 7

Figure 2:
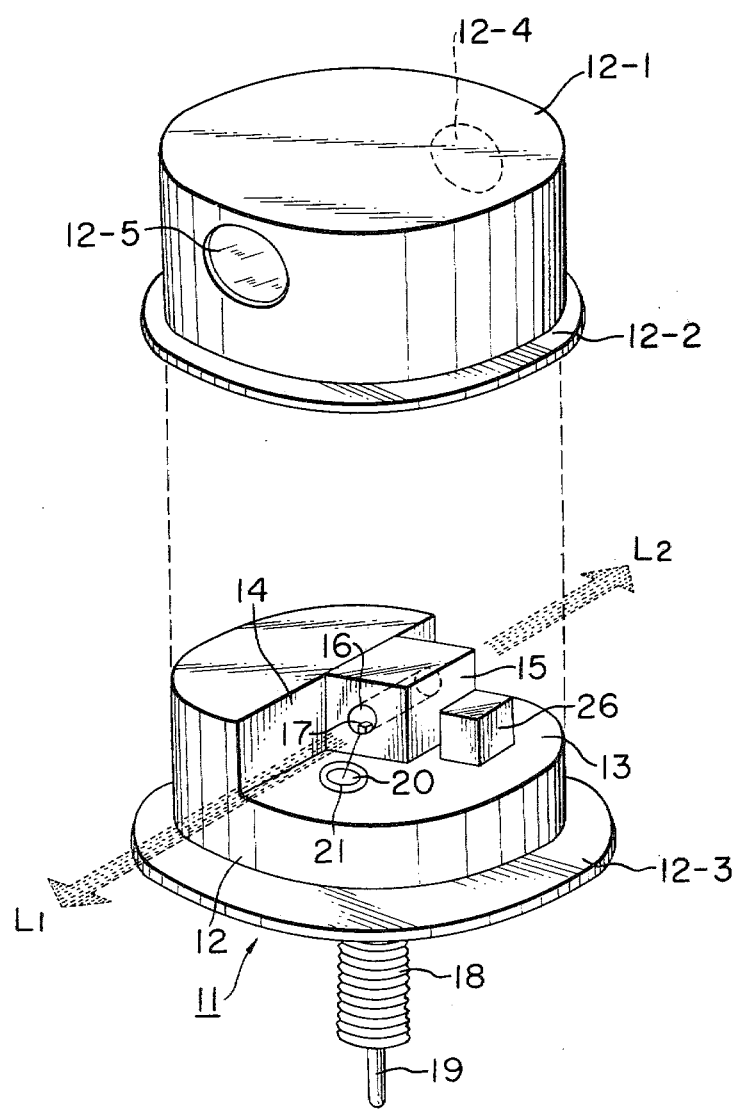
FIG. 2 is a perspective view of a first embodiment of a semiconductor laser apparatus in accordance with the present invention, a metal cap being removed to show the components inside the cap.

FIG. 2 is a perspective view of a first embodiment of a semiconductor laser apparatus 11 in accordance with the present invention. The semiconductor laser apparatus 11 includes a base 12 made of a metal such as pure copper having a high thermal conductivity and formed with a horizontal face 13 and a vertical face 14 substantially perpendicular to the horizontal face 13. A mounting screw 18 is attached to the bottom of the base 12 and made into electrical contact therewith, and a lead 19 is extended through the mounting screw 18 in electrically isolated relationship therewith in such a way that the upper end 20 of the lead 19 is coplanar with the horizontal face 13. An insulating ring 21 is fitted between the upper end 20 of the lead 19 and the horizontal face 13 in order to ensure the electrical isolation between them.

Another base 15 in the form of a regular hexahedron and made of a metal such as pure copper having a high thermal conductivity is mounted on the base 12 with the bottom and one vertical face of the base 15 made into very intimate contact with the horizontal and vertical faces 13 and 14, respectively, of the base 12. Alternatively, the base 15 may be preferably formed integral with the base 12. The base 15 is formed with a horizontal through hole 16, and a semiconductor laser device or tip 17 is soldered with indium or the like at a position in proximity to one end (the left end in FIG. 2) of the through hole 16 so that the intimate thermal contact between the base 15 and the semiconductor laser tip 17 may be attained.

Figure 1:
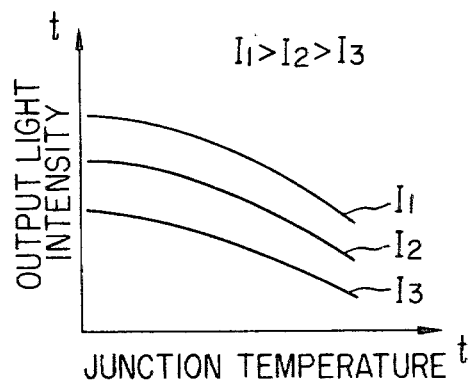
FIG. 1 shows the relationship between the junction temperature and the output light intensity.
Figure 3:
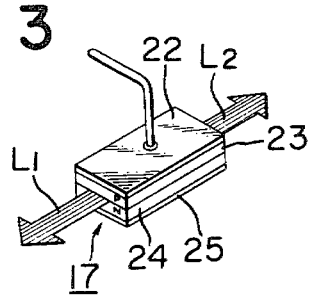
FIG. 3 is a perspective view of a semiconductor laser tip used in the present invention.

In FIG. 3 the semiconductor laser tip 17 is shown in detail. It consists of a lamination consisting of a positive electrode contact 22, a p-layer 23, an n-layer 24 and a negative electrode contact 25, and when current flows through the positive and negative electrode contacts 22 and 25, laser beams L1 and L2 are emitted in the opposite directions. More particularly the positive electrode contact 22 is electrically connected to the upper end 20 of the lead 19 which in turn is connected to the positive terminal of a power source while the negative electrode contact 25 is electrically connected to the base 15 which in turn is connected through the base 12 and the mount screw 18 to the negative terminal of the power supply (See FIG. 7).

Referring back to FIG. 2, a conventional heat sensor or thermoelectric element 26, such as a thermistor, a thermocouple, is mounted on the horizontal face 13 of the base 12 in intimate thermal contact relationship therewith and adjacent to the semiconductor laser tip 17. Since the semiconductor laser tip 17 and the heat sensor 26 are mounted on the same base (the bases 12 and 15 may be regarded as an integral unit), the heat sensor 26 is sufficiently sensitive to the heat transmitted or dissipated through the bases 12 and 15 so that the heat sensor 26 need not be in physically intimate contact with the semiconductor laser tip 17. In other words, it is sufficient to have the heat sensor 26 in thermal contact with the semiconductor laser tip 17. The heat sensor 26 senses the temperature of the semiconductor laser tip 17.

Still referring to FIG. 2, a cap 12-1 is made of a metal or alloy and formed with a flange 12-2 which is welded to a flange 12-3 formed integral with the base 12 so that the base 15, the semiconductor laser tip 17 and the heat sensor 26 may be air-tightly sealed. The cap 12-1 is further formed with transparent windows 12-4 and 12-5 made of glass or the like for transmitting the laser beams L1 and L2 therethrough.

Figure 4A:
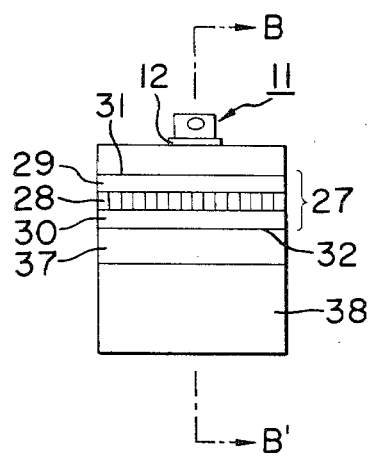
FIG. 4A is a front view of a cooling unit incorporated with the semiconductor laser apparatus shown in FIG. 2.
Figure 4B:
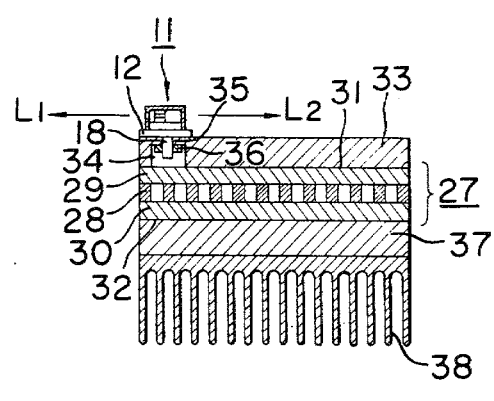
FIG. 4B is a sectional view taken along the line B—B' of FIG. 4A.

Modification, FIGS. 4A and 4B

In the modification shown in FIGS. 4A and 4B, the semiconductor laser apparatus with the construction described above with reference to FIGS. 2 and 3 is further provided with a Peltier-effect cooling arrangement (a temperature control means) and a radiator.

As is well known in the art, the Peltier-effect cooling arrangement 27 comprises a Peltier-effect layer 28, an upper metal plate 29 which is attached to the upper major surface of the Peltier-effect layer 28 and which serves as an electrode as well as a cooling plate (or heat absorbing portion) and a lower metal plate 30 which is attached to the lower major surface of the Peltier-effect layer 28 and which serves as an electrode and as a heat radiating plate (or heat radiation portion), the upper and lower metal plates 29 and 30 being overlaid with insulating layers 31 and 32 respectively.

A metal plate 33 is laid over the insulating layer 31, and a groove or slot 34 is formed in the undersurface of the metal plate 33. A vertical through hole 35 is drilled or otherwise formed through the metal plate 33, and opens its lower end at the midpoint between the ends of the groove or slot 34. The mounting screw 18 of the semiconductor laser apparatus 11 is inserted into the vertical through-hole 35 and is securely held in position with a nut 36 so that the metal base 12 of the semiconductor laser device 11 may be brought into very intimate contact with the upper surface of the metal plate 33. Therefore when the cooling plate 29 of the Peltier-effect cooling arrangement 27 is cooled, the heat dissipated from the semiconductor laser tip 17 through the metal base 12 and the metal plate 33 may be effectively absorbed by the cooling plate 29.

A metal plate 37 made of a metal such as pure copper having a high thermal conductivity is laid over the lower insulating layer 32, and a fin radiator 38 is attached to the metal plate 37.

In the modification shown in FIGS. 4A and 4B, the heat dissipated from the semiconductor laser tip 17 may be effectively absorbed, and the absorbed heat energy may be effectively radiated by the fin radiator 38.

The light emitted from the semiconductor laser apparatus of the type described may be more correctly controlled in intensity with an additional circuit shown in FIG. 5. In order to detect the intensity of the laser beam L2, a photoelectric converter 39, such as a photodiode, phototransistor, is provided, and the output from the photoelectric converter 39 is applied to a current control 40. In response to the output from the converter 39 the current control 40 generates a signal which is transmitted through a signal line 41 to the semiconductor laser tip 17 so that the laser beam with a uniform intensity may be emitted.

In FIG. 6 the circuit of the current control is shown in detail. The output from the photoelectric converter 39 is applied to terminals 42 and 43 and then applied to an inverting input 45 of an operational amplifier 44. A reference voltage generated from a potentiometer 47 is applied to a noninverting input 46 of the operational amplifier 44. It is assumed that the photoelectric converter 39 is such that with increase in intensity of laser beam the output voltage increases. Then with increase in intensity of laser beam emitted from the semiconductor laser tip 17, the output from the operational amplifier 44 drops, but with decrease in intensity of laser beam, the output from the operational amplifier 44 increases. Thus the intensity of laser beam may be always maintained at a constant level.

Referring back to FIG. 5, the output from the heat sensor 26 is applied to a cooler driver 48 which in turn drives the Peltier-effect cooling arrangement 27.

The cooler driver 48 is shown in detail in FIG. 7. The output from the heat sensor 26 is applied to terminals 49 and 50 and thus to a noninverting input 52 of an operational amplifier 51. A reference voltage generated from a potentiometer 54 is applied to an inverting input 53 of the operational amplifier 51.

The output from the operational amplifier 51 is applied to a relay 55. When the relay 55 is energized, its make contact 56 is closed so that a power supply 57 is connected to the Peltier-effect cooling arrangement 27.

It is assumed that with increase in temperature of the laser tip 17 the output voltage from the heat sensor 26 increases. Then with the increase in temperature of the semiconductor tip 17, the output from the operational amplifier 51 increases so that the relay 55 is energized to close the contact 56. As a result, the cooling arrangement 27 is driven to cool the semiconductor laser tip 17. When the temperature of the semiconductor laser tip 17 is cooled in the manner described above, the output voltage from the heat sensor 26 drops so that the output voltage from the operational amplifier 51 also drops. As a result, the relay 55 is deenergized to open the relay contact 56 so that the power supply 57 is disconnected from the cooling arrangement 27.

Second Embodiment, FIGS. 8A–8E

In the second embodiment shown in FIGS. 8A–8E the semiconductor laser tip, the cooling unit and the heat sensor are assembled as a module 60.

The semiconductor laser apparatus 60 includes a heat sink or radiation member 61 formed with mounting holes 62 and 63 for mounting the fin radiator of the type shown in FIGS. 4A and 4B.

A Peltier-effect cooling unit 64 of the type described above with reference to FIGS. 4A and 4B is mounted on the heat sink or radiation member 61. More particularly a metal plate 66 which is laid over the undersurface of a Peltier-effect layer 65 is made into contact with the heat sink or radiation member 61 through an insulating layer 67.

An upper metal plate 68 which is laid over the upper surface of the Peltier-effect layer 65 and which serves as an electrode and as a cooling plate is made into intimate contact through an insulating layer 69 with a base made of a metal such as pure copper having a high thermal conductivity. As best shown in FIG. 8B the base 70 is larger in area than the upper metal plate 68 and has outwardly extended portions 71, 72 and 73. The extended portions 71 and 72 are formed with through-holes 74 and 75, respectively, (See FIG. 8D), and screws 76 and 77 are inserted into these through-holes 74 and 75, respectively, and screwed into tapped holes 78 and 79, respectively, of the heat sink 61. Thus the base 70 and the cooling unit 64 may be securely mounted on the heat sink or radiation member 61. The screws 76 and 77 are preferably made of an electrically insulating material such as plastic having a poor thermal conductivity.

Figure 8A:
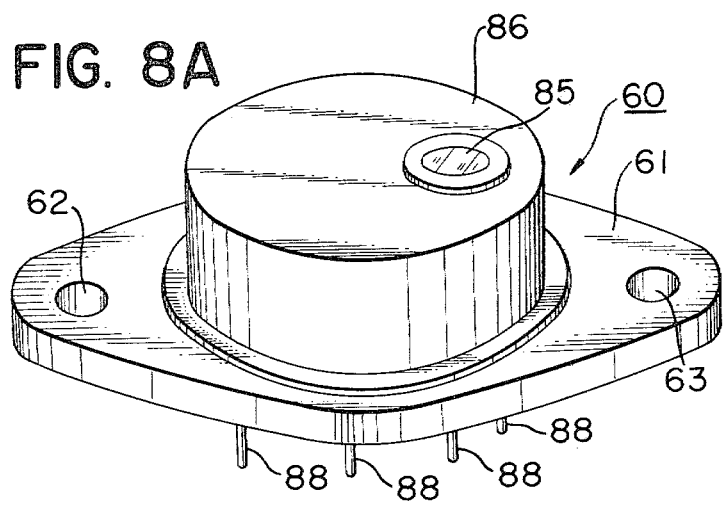
FIG. 8A is a perspective view of a second embodiment of the present invention.
Figure 8B:
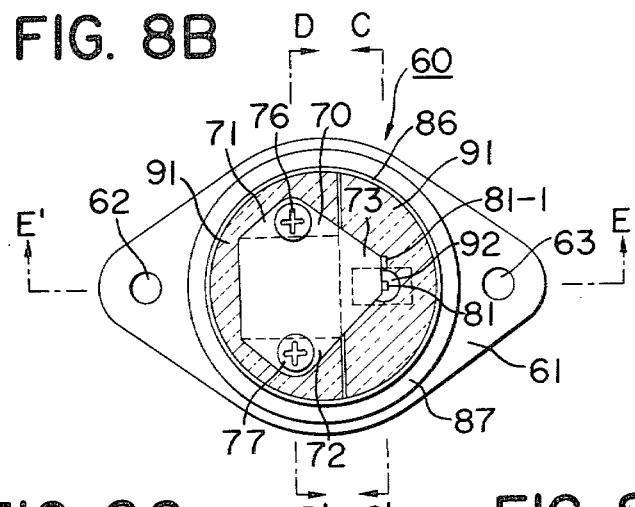
FIG. 8B is a top view thereof with a cap removed.
Figure 8C:
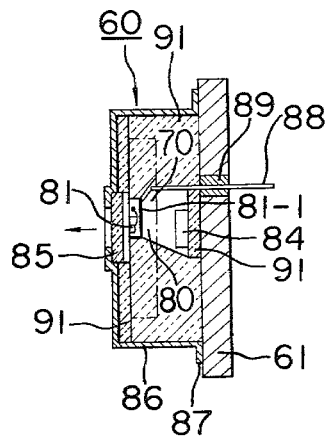
FIG. 8C is a sectional view taken along the line C-C' of FIG. 8B.
Figure 8D:
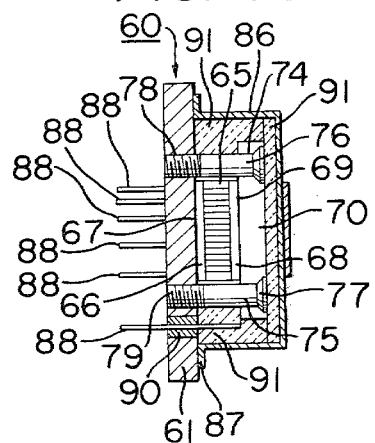
FIG. 8D is a sectional view taken along the line D-D' of FIG. 8B.
Figure 8E:
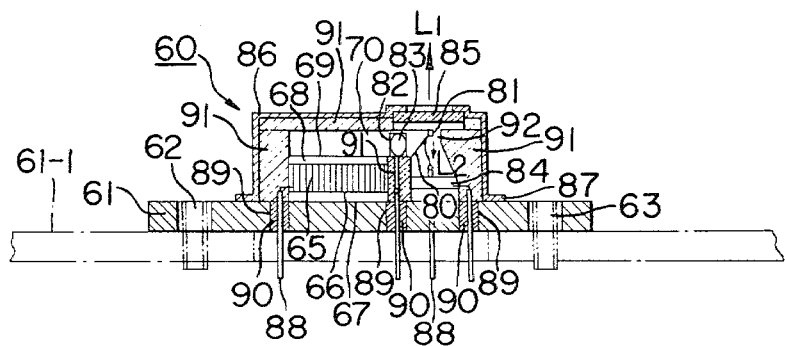
FIG. 8E is a sectional view taken along the line E-E' of FIG. 8B.

As best shown in FIG. 8E, the extended portion 73 of the base 70 is in the form of a knife edge in cross section, and a semiconductor laser tip 81 of the type described above in conjunction with FIG. 3 is attached to one end of the upper edge of the downwardly inwardly inclined surface 80 of the extended portion 73 of the base 70, and one of the electrodes of the semiconductor laser tip 81 is connected through a junction terminal 81-1 attached at the other end of the upper edge of the extended portion 73 of the base 70 (as best shown in FIG. 8B) to a lead 88 to be described below. As best shown in FIG. 8E a recess 82 is formed in the bottom of the base 70 between the downwardly inwardly inclined surface 80 of the extended portion 73 and the upper metal plate 68 of the cooling unit 64, and a thermistor (or heat sensor) 83 is embedded into this recess 82 in thermal contact relationship with the base 70.

A silicon blue cell or light sensor 84 is mounted on the heat sink or base 61 immediately below the semiconductor laser tip 81 on the base 70 in such a way that the laser beam emitted from the semiconductor laser tip 81 may be incident upon the light sensor or cell 84. (See FIG. 8E). The light sensor or cell 84 which detects the intensity of the laser beam L2 may be mounted on the heat sink or base 61 with a heat insulating member interposed therebetween.

As shown in FIG. 8A, these components are airtightly sealed with a metal cap 86 provided with a transparent window 85 through which the laser beam L1 emitted from the semiconductor laser tip 81 is transmitted. The flange 87 of the cap 86 is soldered to the heat sink or base 61.

For electrical connection with the cooling unit 64, the semiconductor laser tip 81, the thermistor 83 and the light sensor 84, the leads or pins 88 are extended through-holes 89 formed through the heat sink or base 61 and electrically insulated from the base 61 and airtightly sealed with insulation and sealing members 89 fitted into the holes 89. (See FIGS. 8C and 8E).

The interior surface of the metal cap 86 is lined with thermally insulating members 91 except laser beam passageways. That is, the insulating members 91 are not placed in the optical path for the laser beam L1 between the semiconductor laser tip 81 and the transparent window 85 of the cap 86 and an optical path for the laser beam L2 between the semiconductor laser tip 81 and the light sensor or cell 84.

The semiconductor laser tip 81 is closely surrounded with the insulating member 91 which also serves as a light shielding member so that the exterior light which impinges through the window 85 of the cap 86 on the semiconductor laser tip 81 may be minimized; that is, in order to minimize an opening or aperture 92.

The airtightly sealed space within the cap 86 may be evacuated or filled with dry nitrogen gas so that the operation of the semiconductor laser tip 81 may be carried out in a stable atmosphere. In addition, the additional circuit of the type described above with reference to FIGS. 5, 6 and 7 may be connected to the semiconductor laser apparatus 60 through the leads 88. That is, the current control 40 is connected through the lead 88 to the semiconductor laser tip 81 while the cooler driver 48 is connected through the lead 88 to the cooling unit 64.

Since the light sensor 84 is placed in the airtightly sealed space, it is hardly adversely affected by the surrounding temperature. Furthermore the light sensor 84 is placed in the cool atmosphere because the heat is dissipated from the heat sink or base 61 to the surrounding atmosphere. Thus the remarkably stable operation of the semiconductor laser apparatus may be ensured.

Figure 9:
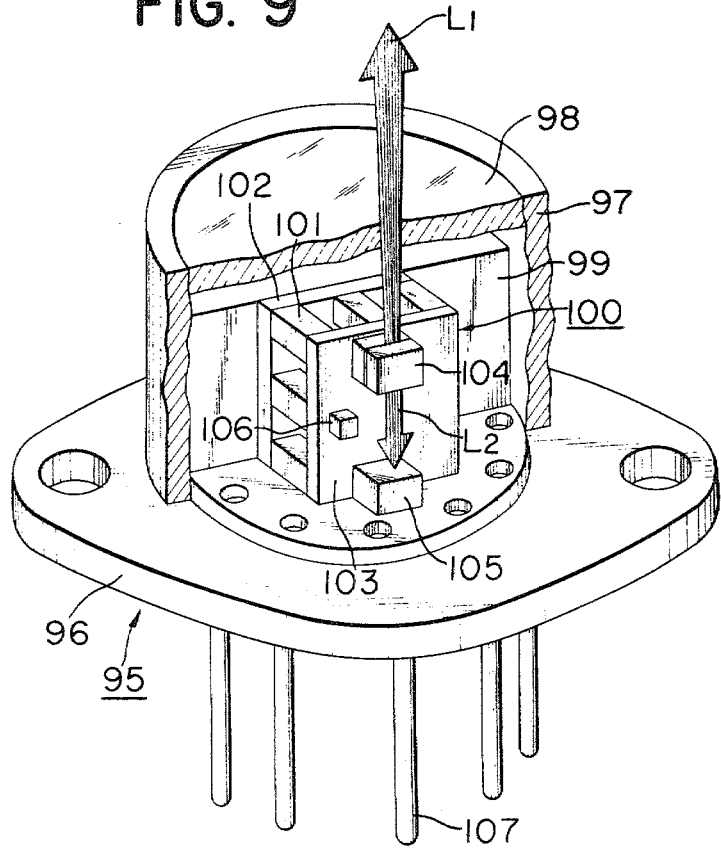
FIG. 9 is a perspective view, partly in section, of a third embodiment of the present invention.
Figure 10:
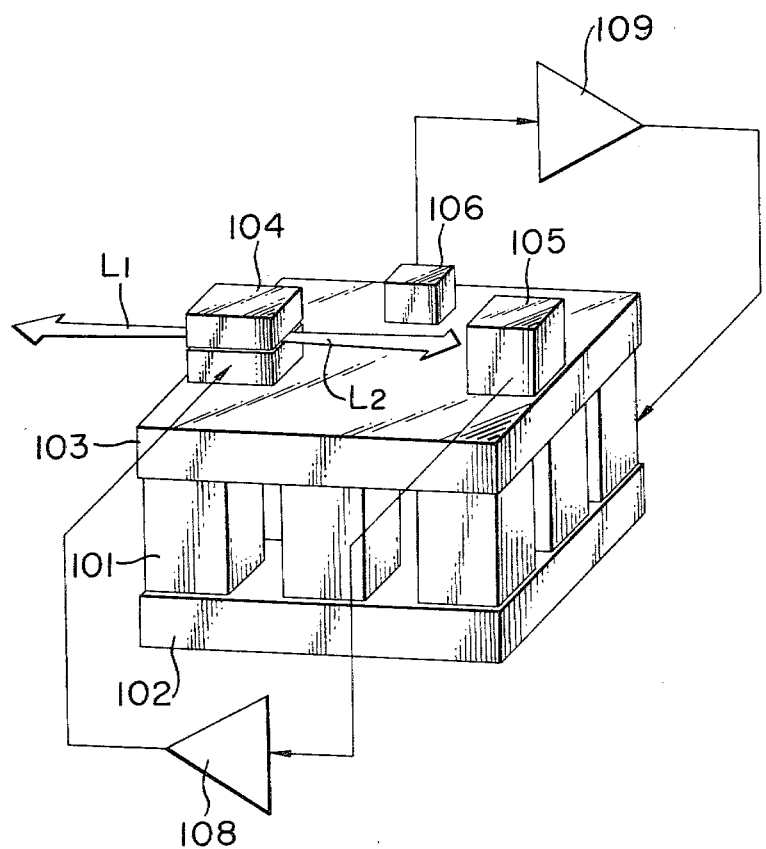
FIG. 10 is a schematic diagram of a control circuit for controlling the semiconductor laser apparatus shown in FIG. 9.

Third Embodiment, FIGS. 9 and 10

In the third embodiment shown in FIGS. 9 and 10, the light intensity detecting means is also placed in such a manner that is may be maintained at a predetermined temperature. That is, the light intensity detecting means is also mounted on a base upon which is mounted a semiconductor laser tip, and the base or heat sink is so controlled as to maintain a predetermined temperature. Thus the light intensity detecting means may be also suitably temperature controlled.

Referring to FIG. 9, the components of the semiconductor laser apparatus are encapsulated within a metal can type IC case, and leads of these components are not shown for the sake of simplicity.

The metal can type IC case generally indicated by the reference number 95 comprises a base 96 made of a metal and a cylindrical portion 97 formed integral with the base 96. The open end of the cylindrical portion 97 is airtightly closed with a glass disk 98 so that an hermetically sealed space may be defined by the base 96, the cylindrical portion 97 and the glass disk or cap 98.

Within the airtightly sealed space, a semicylindrical metal block 99 is mounted on the base 96 with the curved peripheral surface thereof made into very close contact with the interior surface of the cylindrical portion 97. Alternatively, the metal base 99 may be formed with the base 96 and the cylindrical portion 97.

A cooling arrangement generally indicated by the reference numeral 100 comprises Peltier-effect elements 101 sandwiched between a heat radiation end plate 102 and a heat absorbing end plate 103, and the cooling arrangement 100 is mounted on the base 96 with the heat radiation end plate 102 made into very intimate contact with the vertical flat surface of the semicylindrical metal block 99.

During operation of the cooling arrangement 100, the heat radiation end plate 102 is heated, and the heat is dissipated through the metal block 99, the cylindrical portion 97 and the base 96 to the surrounding atmosphere.

A semiconductor laser tip 104 of the type described above in conjunction with FIG. 3 is mounted on the heat absorption or cooling end plate 103 in such a way that the laser beam L1 emitted therefrom may be directed toward the sealing glass 98 while the laser beam L2 is directed to and made incident on a photodiode or light sensor 105 also mounted on the cooling end plate 103.

A temperature sensor 106 such as thermistor is mounted also on the cooling end plate 103. It is important that the semiconductor laser tip 104, the light sensor 105 and the temperature sensor 106 are maintained in close thermal contact relationship with the cooling end base 103. These elements are under the same thermal conditions.

For electrical connection with these components 104, 105 and 106, the base 96 is provided with pins 107, the leads interconnecting the semiconductor laser tip 104, the light sensor 105, the temperature sensor 106 and these pins 107 being not shown for the sake of simplicity.

In FIG. 10 there is shown a control circuit for controlling the semiconductor laser apparatus of the type shown in FIG. 9. In response to the output from the light sensor 105, a light intensity control 108 controls a power supply of the semiconductor laser tip 104 in such a way that the intensity of the laser beams L1 and L2 may be always maintained constant. The control circuit 108 is substantially similar in construction to the current control 40 described in conjunction with FIG. 5. In response to the output from the temperature sensor 106, a temperature control 109 controls the cooling unit 100 in such a way that the cooling end plate thereof may be always maintained at a constant temperature. The control circuit 109 is substantially similar in construction to the cooler driver described hereinbefore with reference to FIGS. 5 and 7.

With the semiconductor laser apparatus with the construction described above, the intensity of the laser beam L1 may be always maintained at a predetermined level regardless of the change in environmental temperature and aging. Since the semiconductor laser tip, the light sensor and the temperature sensor are mounted on the same cooling end plate of the cooling unit, the semiconductor laser apparatus may be controlled with a higher degree of accuracy.

Instead of the metal can type IC case 95, any suitable case may be used, but the use of the case 95 is advantageous in that the whole peripheral surface of the case may be used as a heat radiation surface. Furthermore it is preferably to evacuate the case 95 so that the supercooling of the glass 98 may be prevented and consequently the condensation of water on the glass 98 may be avoided.

So far the temperature control means has been described as consisting of the Peltier-effect element, but it is to be understood that any other suitable temperature control means may be employed. In addition, heating may be employed in order to maintain a constant temperature of semiconductor laser apparatus.

With the laser beam of a wavelength in the infrared region, the temperature detecting sensitivity of the light intensity detecting means varies over a wide range depending upon the environmental temperature, but according to the present invention the temperature of the light intensity detecting means may be also maintained constant so that the intensity of laser beam may always be detected in a reliable manner and with a higher degree of accuracy.

What we claim is:

1. A semiconductor laser apparatus comprising:
   heat radiation means;
   a sealing means made of metal and in operative contact with said heat radiation means for defining an airtight space therebetween;
   a base housed within said airtight space;
   a semiconductor laser tip operative in response to the application of current thereto for emitting a laser beam, the intensity of which is dependent upon temperature, said semiconductor laser tip being fixedly mounted on a portion of said base within the sealed space;
   a temperature control means in the airtight space and including a heat absorption portion provided in close contact relation with said base and a heat dissipation portion provided in close contact relation with said heat radiation means;
   a laser beam transmitting means associated with at least a portion of said sealing means for transmitting the laser beam emitted from said semiconductor laser tip to the exterior of said sealing means; and
   a temperature sensor mounted on said base in intimate thermal contact relationship therewith for sensing the temperature of said base.

2. A semiconductor laser apparatus according to claim 1, wherein a thermally insulating means is disposed between said base and said sealing means in said airtight space defined by said sealing means to tightly surround said semiconductor laser tip.

3. A semiconductor laser apparatus according to claim 1, further comprising a mounting means for mounting said base on said temperature control means.

4. A semiconductor laser apparatus according to claim 1, wherein said temperature sensor is embedded in a recess formed in said base.

5. A semiconductor laser apparatus according to claim 1, wherein said base has a portion which projects outwardly of said heat absorption portion of said temperature control means, and said semiconductor laser tip is fixedly mounted on a leading edge of the projecting portion of said base.

6. A semiconductor laser apparatus according to claim 5, wherein said temperature sensor is also mounted on the projecting portion of said base.

7. A semiconductor laser apparatus comprising:
a semiconductor laser device operative in response to the application of current for emitting a laser beam, the intensity of which is dependent upon temperature;
a base made of a metal for supporting said semiconductor laser device thereon in very intimate thermal contact relationship therewith;
a temperature sensor mounted on said base in intimate thermal contact relationship therewith for sensing the temperature of said semiconductor laser device;
a metal sealing means for airtight sealing at least said semiconductor laser device and said temperature sensor;
a laser beam transmitting means associated with said sealing means for transmitting the laser beam emitted from said semiconductor laser device placed in the airtight space to the exterior of said sealing means;
a temperature control means provided in the airtight space and including a heat absorption portion provided in close contact relation with said base and a heat dissipation portion provided in close contact relation with said metal sealing means; and
driver means, responsive to an output from said temperature sensor, for driving said temperature control means.

8. A semiconductor laser apparatus according to claim 7, wherein said heat absorption portion is provided in contact with a metal plate held in intimate contact with said base.

9. A semiconductor laser apparatus set forth in claim 8, further comprising a heat radiation means provided in very close contact with said heat dissipation portion of said temperature control means.

10. A semiconductor laser apparatus comprising:
a semiconductor laser device operative in response to the application of current for emitting a laser beam, the intensity of which is dependent upon temperature, wherein said semiconductor laser device emits laser beams in opposite directions;
a base made of a metal for supporting said semiconductor laser device thereon in intimate thermal contact relationship therewith;
a temperature sensor mounted on said base in very intimate thermal contact relationship therewith for measuring the temperature of said semiconductor laser device;
a sealing means made of metal for airtight sealing at least said semiconductor laser device and said temperature sensor;
a laser beam transmitting means associated with said sealing means for transmitting one of said laser beams emitted from said semiconductor laser device to the exterior of said sealing means;
a laser beam receiving means mounted on said base in said airtight sealed space defined by said sealing means for receiving the other laser beam emitted from said semiconductor laser device; and
a temperature control means in operative contact with said sealing means for cooling said base;
wherein said temperature control means is mounted within said airtight sealed space defined by said sealing means.

11. A semiconductor laser apparatus comprising;
a heat radiation means;
a sealing means made of metal and in operative contact with said heat radiation means for defining an airtight sealed space therebetween;
a base housed in said airtight space;
a semiconductor laser tip operative in response to the application of current thereto for emitting laser beams in two directions, the intensity of said laser beams being dependent upon temperature, said semiconductor laser device being fixedly mounted on a portion of said base within said airtight space;
a temperature control means in the airtight space and including a heat absorption portion provided in close contact relation with said base and a heat dissipation portion provided in close contact relation with said heat radiation means;
a laser beam transmitting means associated with at least a portion of said sealing means for transmitting one of said laser beams emitted from said semiconductor laser tip to the exterior of said sealing means; and
a laser beam receiving element housed in said airtight space for receiving the other laser beam emitted from said semiconductor laser tip in the direction opposite to the direction of said one laser beam.

12. A semiconductor laser apparatus according to claim 11, further comprising a light shielding means for reducing the exterior light incident through said laser beam transmitting means upon said laser beam receiving element placed in said airtight space.

13. A semiconductor laser apparatus according to claim 11, further comprising a temperature sensor mounted on said base in intimate thermal contact relationship therewith for sensing the temperature of said base.

14. A semiconductor laser apparatus comprising:
means, made of a thermally-conductive material, for defining an airtight sealed space;
temperature control means including a heat absorption section and a heat dissipation section provided in the airtight space and in close contact relation with said airtight space defining means;
a semiconductor laser tip mounted on the heat absorption section of said temperature control means and placed within the airtight space;
a laser beam transmitting window formed at a portion of said airtight space defining means for transmitting the laser beam emitted from said semiconductor laser tip to the exterior of said airtight space defining means; and
a temperature sensor provided in said airtight space and in intimate thermal contact relationship with said semiconductor laser tip for sensing the temperature of said semiconductor laser tip.

15. A semiconductor laser apparatus according to claim 14, wherein said temperature control means includes a thermally conductive base in the heat absorption section thereof, and wherein said semiconductor laser tip and said temperature sensor are mounted on the base of said temperature control means.

16. A semiconductor laser apparatus according to claim 14, wherein said temperature control means includes a Peltier effect cooler.

17. A semiconductor laser apparatus according to claim 14, wherein a thermally insulating means is provided in the airtight space to tightly surround said semiconductor laser tip.

18. A semiconductor laser apparatus comprising:

a semiconductor laser tip for emitting laser beams in two directions;

sealing means for sealing said semiconductor laser tip within an airtight sealed space;

transmission means for guiding the laser beam emitted in one direction from said semiconductor laser tip to the exterior of said sealing means;

a laser beam receiving element housed in said sealing means for receiving the laser beam emitted in the other direction from said semiconductor laser tip; and a light shielding means, provided within said sealing means and disposed in a light path through which exterior light is incident from said laser beam transmission means upon said laser beam receiving element, for reducing the exterior light.

19. A semiconductor laser apparatus comprising:

a semiconductor laser tip for emitting laser beams in two directions;

a base on which said semiconductor laser tip is fixed;

sealing means for sealing said base and said semiconductor laser tip within an airtight sealed space;

transmission means for guiding the laser beam emitted in one direction from said semiconductor laser tip to the exterior of said sealing means;

a laser beam receiving element housed in said sealing means for receiving the laser beam emitted in the other direction from said semiconductor laser tip; and a light shielding means for reducing the exterior light incident through said laser beam transmission means upon said laser beam receiving element, said light shielding means surrounding said semiconductor laser tip in conjunction with said base and disposed in a light path through which exterior light is incident from said laser beam transmission means upon said laser beam receiving element.

* * * * *